(12) United States Patent
Kuppuswamy (10) Patent No.: US 7,183,774 B2
(45) Date of Patent: Feb. 27, 2007

(54) METHOD OF DETECTING PARTIAL DISCHARGES AND DIAGNOSTIC SYSTEM FOR ELECTRICAL APPARATUS

(75) Inventor: Raja Kuppuswamy, Paris (FR)

(73) Assignee: Areva T&D SA, Levallois-Perret (FR)

( * ) Notice: Subject to any disclaimer, the term of this patent is extended or adjusted under 35 U.S.C. 154(b) by 0 days.

(21) Appl. No.: 10/856,960

(22) Filed: Jun. 1, 2004

(65) Prior Publication Data

US 2004/0246000 A1 Dec. 9, 2004

(30) Foreign Application Priority Data

Jun. 5, 2003 (FR) .................................. 03 06808

(51) Int. Cl.
*H01H 9/50* (2006.01)
*H01H 31/12* (2006.01)
(52) U.S. Cl. ...................................... 324/536; 324/551
(58) Field of Classification Search ................ 324/512, 324/500, 520, 522, 523, 529, 122, 535–537, 324/541, 544, 546, 750, 551, 552, 555; 702/38, 702/58, 59, 65, 182–185; 340/635, 647; 361/78, 86, 87
See application file for complete search history.

(56) References Cited

U.S. PATENT DOCUMENTS

| | | | | |
|---|---|---|---|---|
| 5,627,941 A | * | 5/1997 | Takahashi et al. ............ 706/25 |
| 5,642,038 A | * | 6/1997 | Kim et al. ................. 324/76.19 |
| 5,903,159 A | * | 5/1999 | Miyata et al. ............... 324/536 |
| 6,172,862 B1 | * | 1/2001 | Jonnatti et al. ................ 361/78 |
| 6,313,640 B1 | | 11/2001 | Nasrallah et al. |
| 6,323,655 B1 | | 11/2001 | Fu et al. |
| 6,483,316 B2 | * | 11/2002 | Kato et al. ................... 324/536 |
| 6,661,235 B2 | * | 12/2003 | Rokunohe et al. .......... 324/536 |
| 6,809,523 B1 | * | 10/2004 | Ahmed et al. ............... 324/520 |
| 7,071,701 B2 | * | 7/2006 | Roman et al. ............... 324/536 |
| 2002/0163344 A1 | | 11/2002 | Rokunohe et al. |
| 2006/0145705 A1 | * | 7/2006 | Raja ............................ 324/536 |

FOREIGN PATENT DOCUMENTS

| | | |
|---|---|---|
| EP | 0 342 597 | 11/1989 |
| EP | 1 024 573 | 8/2000 |
| WO | WO 01/18554 | 3/2001 |

* cited by examiner

*Primary Examiner*—Andrew H. Hirshfeld
*Assistant Examiner*—Hoai-An D. Nguyen
(74) *Attorney, Agent, or Firm*—Oblon, Spivak, McClelland, Maier & Neustadt, P.C.

(57) ABSTRACT

The invention provides a method of detecting partial discharges in an electrical appliance insulated in a receptacle and a system of diagnosing the state of the appliance using this method. With the help of an UHF antenna placed in the receptacle of the appliance, the method includes analyzing the spectrum (RS1) of the electromagnetic signal picked up by the antenna and of identifying within the spectrum one or more frequencies of interest (B1, B2), for each of which the signal has an amplitude greater than a predetermined threshold value. To identify the frequency/frequencies of interest, the spectrum of the signal received by the antenna is compared with a reference spectrum (RS2).

8 Claims, 6 Drawing Sheets

METHOD OF DETECTING PARTIAL DISCHARGES AND DIAGNOSTIC SYSTEM FOR ELECTRICAL APPARATUS

The invention concerns the detection of partial electrical discharges occurring in high-voltage electrical apparatus insulated in a receptacle, such as a transformer insulated in a liquid dielectric. The detection of partial electrical discharges allows insulation faults in the electrical appliance to be diagnosed and its lifetime to be assessed.

In classical terms, the detection of the presence of partial electrical discharges in the receptacle of such an electrical appliance relies on the measurement of electromagnetic radiation within the receptacle by means of an UHF antenna. This method allows a diagnostic of the electrical appliance without having to interrupt its operation.

However, the electromagnetic radiation picked up by the UHF antenna includes a significant amount of electromagnetic noise that undermines the reliability of such measurements. This noise, which is due among other things to coronal discharges occurring in the environment of the electrical appliance, is difficult to take into account since it depends on the environment of the electrical appliance being tested, on its charge and on other parameters. Electromagnetic noise varies greatly from one appliance to another, and this makes it difficult to isolate partial discharges.

Patent document US-2002163344 demonstrates how to perform a spectral analysis of the electromagnetic signal picked up by the UHF antenna by comparing the maximum signal amplitude at threshold values for one or more predetermined frequencies. This method of detecting partial discharges in the receptacle of an electrical appliance tends to separate off the noise component of the signal received by the antenna. However, as this noise is very different from one appliance to another, the accuracy of detection remains inadequate. In this document, it is suggested that a comparison be made using a network of neurons. Given that the variation in electromagnetic noise is important, recourse to a neural network does not seem likely to improve the reliability of detection.

Patent no. WO-0118554 describes a device including an ultrasound sensor and a flat capacitor plate for the detection, respectively, of an ultrasound pulse and radio-frequency pulse generated by a partial discharge. The sensor signals are analysed by signal processing to determine the appearance of discharges. When a discharge appears in an appliance, it produces an ultrasound pressure wave that moves according to the classical laws of physics and that is picked up by ultrasound sensor 2. If a radio-frequency pulse was detected in a predetermined period of time before the ultrasound signal, a partial discharge is considered actually to have occurred. Nevertheless, this combination of ultrasound and radio frequency waves is not independent of noise. Several sources of noise may disturb measurements, the most important coming from the magnetostriction of the transformer core that continually generates ultrasound.

In another recognized method of measurement, an RLC resonator circuit is connected to an insulating part of the electrical appliance, and a condenser is placed in series with the resonator circuit to form a discharge loop. An impedance usually insulates the discharge loop from the high-voltage source. The RLC circuit has a resonance range located between 30 kHz and 300 kHz and is configured to deliver a response signal with a predefined frequency that can easily be detected by a measuring device. This method is adapted to tests with weak electromagnetic noise, as for example in a laboratory. In fact, the resonance circuit gives the same response for all pulse signals, although it is not possible to distinguish the partial discharge signal from noise.

In another recognized method, each partial discharge signal is recorded by a device with a wide pass band, such as a power transformer for radio frequencies. The results from this type of measurement are registered on a sub-microsecond time-scale, corresponding to a frequency band reaching several MHz.

The operative frequency band of several MHz does not exclude noise due to coronal discharges whose frequency band extends much further (up to about 200 MHz).

Patent U.S. Pat. No. 6,313,640 describes a method consisting of two sensors to determine whether partial discharge signals have their origin in the receptacle of the appliance or in an external source. A first sensor is linked to the current feed line to the transformer. A second sensor is located at the transformer output. The signals from the two sensors are passed to a comparison unit that calculates the difference of these two signals so that the resulting signal represents partial discharges occurring within the appliance. This method requires that the appliance be taken off line to calibrate the comparison unit before proceeding with the diagnostic, by sending standard signals to the appliance and by adjusting the gain of the comparison unit to obtain a zero signal. On the other hand, the sensors used are sensitive in a frequency band extending up to 10 MHz, which includes frequencies corresponding to high amplitude coronal discharges.

In another method, known from patent document U.S. Pat. No. 6,323,655, antennae are installed in receptacle of the appliance to detect partial discharge signals in the UHF frequency range. The measuring system is sensitive in one of the two bands 300–600 MHz or 600 MHz–1.2 GHz, which correspond to frequency bands that are not disturbed by coronal discharges. However, these two frequency bands cover signals emitted by television and signals from mobile telephone networks, respectively. Consequently, these higher frequency bands allow coronal discharges to be eliminated but contain other sources of electromagnetic noise that significantly disrupt measurement.

The aim of the invention is to propose an improved method for detecting partial discharges.

To this end, the invention involves a method of detecting partial discharges in an electrical appliance insulated in a receptacle, by using an UHF antenna located in the receptacle, and consists of analysing the spectrum of the electromagnetic signal picked up by the antenna and of identifying in the spectrum one or more frequencies of interest for each of which the signal has an amplitude that is greater than a predetermined threshold value, whereby, to identify the frequency/frequencies of interest, the spectrum of the signal received by the antenna is compared with a reference spectrum.

Moreover, a method according to the invention may offer the following features:
  a frequency of interest is identified when the amplitude difference for this frequency between the signal spectrum received by the antenna and the reference spectrum is greater than a predetermined threshold value;
  a frequency of interest is identified when the amplitude ratio for this frequency between the signal spectrum received by the antenna and the reference spectrum is greater than a predetermined threshold value.

The aim of the invention is also to provide a method of detecting partial discharges in an electrical appliance insulated in a receptacle, using an UHF antenna located in the receptacle, and consists of analysing the spectrum of the electromagnetic signal picked up by the antenna and of identifying in the spectrum several frequencies of interest for each of which the signal has an amplitude that is greater than a predetermined threshold value, whereby, to identify the frequency/frequencies of interest, the spectrum of the signal received by the antenna is compared with a reference spectrum as follows:

for several predefined frequency intervals in the two spectra, a value characteristic of the interval of each spectrum is calculated, and, the characteristic values of the two spectra are compared, interval by interval.

The characteristic value of the interval of each spectrum is, for example, an average value of the signal amplitude in the interval or the energy of the signal in the interval.

According to a first embodiment of the invention, the reference spectrum represents an electromagnetic spectrum picked up by the antenna when the electrical appliance is switch off or when the electrical appliance is first switched on.

According to a second embodiment of the invention, the reference spectrum represents an electromagnetic signal picked up by a second UHF antenna placed in a metal enclosure near the electrical appliance.

The invention also relates to a system intended to diagnose the insulation state of one or more electrical appliances, each of which being insulated in a receptacle, said system comprising a data processing and control unit, equipped to implement the above method of detecting partial discharges, and comprising several UHF antennae that supply a number of electromagnetic signals. These antennae are linked to the processing and control unit via a series parallel converter including a high frequency electromagnetic multiplexer that converts the parallel flows of the electromagnetic signals into a single electromagnetic signal flow.

The invention will now be described in greater detail by referring to the appended diagrams that illustrate a form of implementation by way of example.

Figure 1:
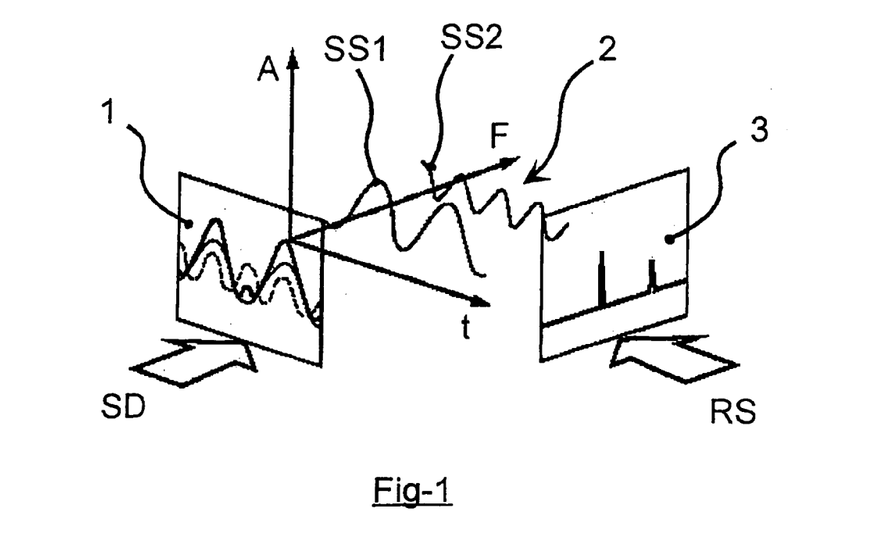
FIG. 1 is a schematic illustration of the conversion of the signal picked up by the antenna into the form of a spectrum.

FIG. 1, a partial discharge signal SD is shown in its time representation 1 with amplitude A as a function of time t. This SD signal is broken down in 2 into its various sinusoidal components, such as SS1 and SS2, to be converted in the form of a frequency spectrum according to representation 3. As is well known, this spectral representation gives the amplitude of each sinusoidal component of the signal SD as a function of its frequency F.

Figure 2:
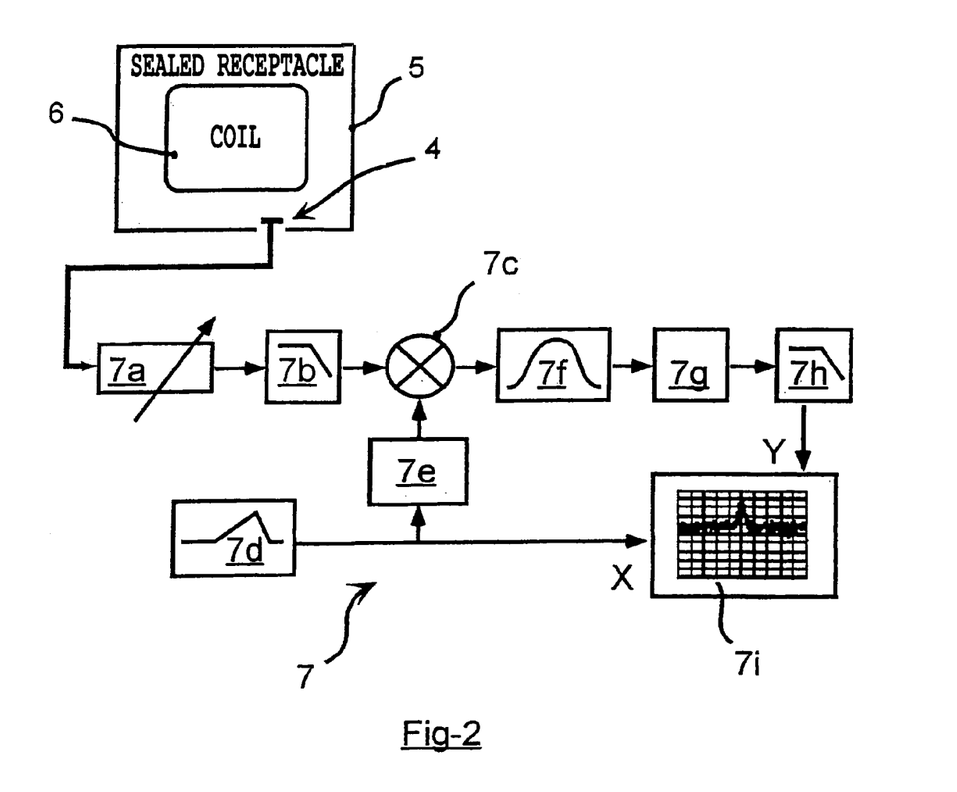
FIG. 2 is a schematic representation of a converter connected to the antenna.

In the invention, this conversion of a time signal SD into a spectral representation RS would, for example, be carried out with a signal converter, such as that represented in FIG. 2.

FIG. 2, a signal converter receives at its input the signal of an UHF antenna 4 and outputs the spectrum of the input signal. The antenna 4 is placed within the sealed receptacle 5 of an electrical appliance that here is a transformer with a coil 6 immersed in a liquid dielectric like oil. The electrical appliance 6 could also be a circuit breaker immersed in a dielectric gas within a sealed receptacle. The signal converter 7 is represented by a block diagram in which the input signal received by the antenna 4 is attenuated by an adjustable resistance 7a, then filtered through a low pass filter 7b to eliminate higher harmonics, before being passed to a mixer 7c. The other input to the mixer 7c receives the signal from an oscillator 7e, which is excited by a ramp generator 7d to generate a signal that progressively sweeps the frequencies of interest in the increasing direction. The signal obtained from the mixer output 7c thus represents the amplitudes of the frequencies of interest of the signal received by the antenna 4. The signal provided by the mixer 7c is filtered and amplified in blocks 7f, 7g and 7h to drive the input to an oscilloscope 7i, the X-input of this oscilloscope being driven by the pulse ramp 7e so as to form the spectrum of the input signal represented in block 7i. Such a converter could be put to good use in implementing the method in the invention, as detailed below.

Figure 3:
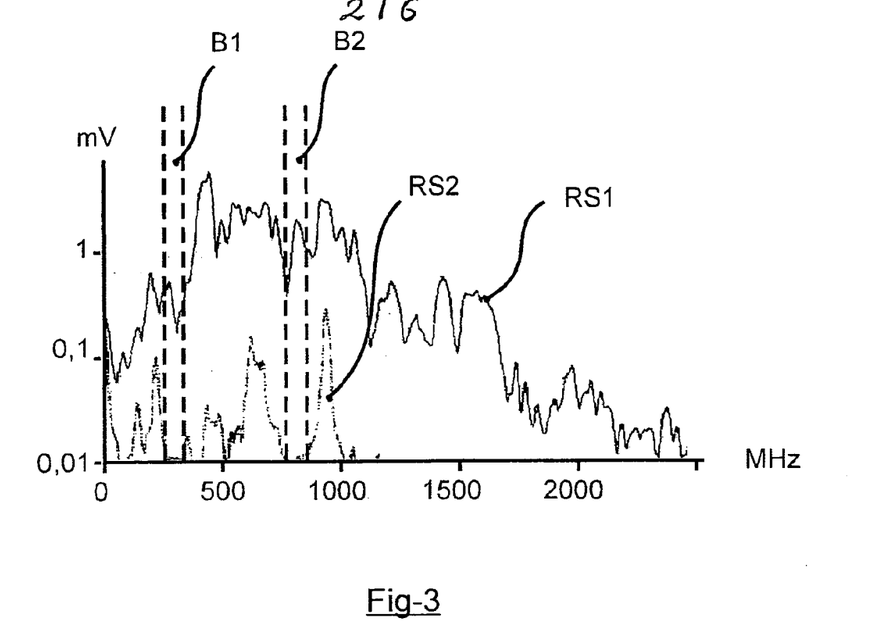
FIG. 3 shows the representative spectra of a partial discharge signal and of a signal of electromagnetic noise.

FIG. 3, a graph displays two spectra RS1 and RS2 representing, respectively, a partial discharge detected in the receptacle of an electrical appliance and electromagnetic noise encompassing this electrical appliance for diagnosis. More particularly, the first spectrum RS1 represents a signal picked up by the antenna 4 during a partial discharge. The second spectrum RS2 is a reference spectrum that represents, for example, a signal picked up by the antenna 4 when the electrical appliance is not generating a partial discharge, for example when the electrical appliance is switched off. Hence, the first spectrum RS1 represents signals from partial discharges added to signals from electromagnetic noise, whereas the second spectrum RS2 represents only signals from electromagnetic noise. FIG. 3 demonstrates that the electromagnetic noise RS2 has an amplitude that varies enormously as a function of frequency. In particular, the electromagnetic noise is practically zero in two frequency bands denoted B1 and B2 and located between 300 and 350 MHz and between 800 and 850 MHz respectively. Electromagnetic noise is also zero for the frequencies located above 1 GHz.

Figure 4:
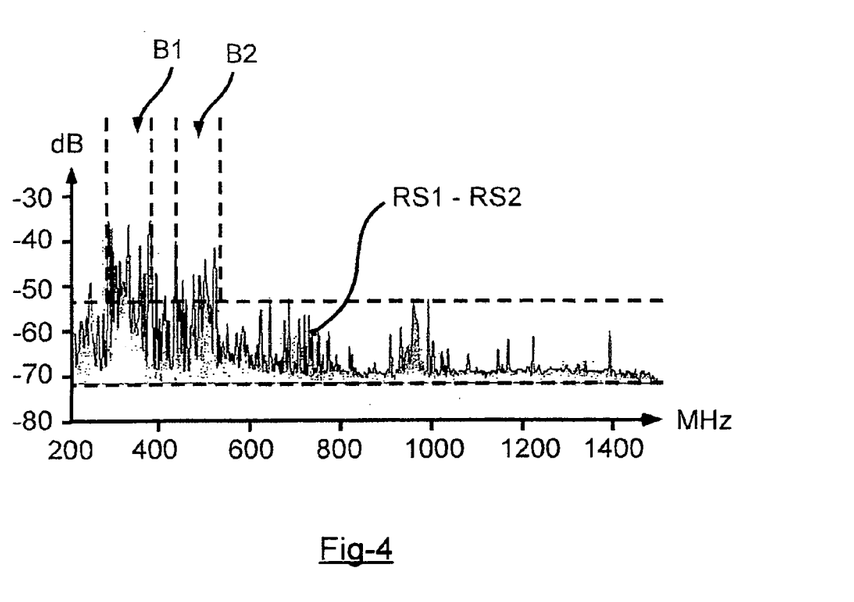
FIG. 4 is an illustration of the identification procedure according to the invention.

According to the invention, the spectrum RS1 of the signal received by the antenna 4 is compared with the reference spectrum RS2 so as to identify one or more frequencies of interest for which the signal and the noise satisfy a criterion of choice. The criterion for identifying the frequencies of interest may, for example, consist of retaining those frequencies for which the ratio of the amplitudes of RS1 and RS2 is greater than a predetermined value, corresponding to signal/noise ratio. If preferred, this criterion may also consist of calculating for a frequency the difference in amplitude between spectrum RS1 and spectrum RS2 so as to identify this frequency as a frequency of interest if this difference is greater than a predetermined threshold value, as illustrated in FIG. 4.

The identification of frequencies of interest may also consist of identifying frequency bands of interest. In FIG. 4, the difference of the spectra is always greater than −70 dB, corresponding to a context in which the noise is very weak and for which all the frequencies could be identified as frequencies of interest. The choice of a threshold value of −55 dB leads to an identification of the frequency bands B1 and B2 as frequency bands of interest, B1 and B2, corresponding respectively to frequencies located between 300 and 400 MHz, and between 450 and 550 MHz.

The reference spectrum RS2 may represent the signal received by the antenna 4 when the electrical appliance is not generating a partial discharge, this spectrum resulting from reference measurements, for example, on the first occasion that the appliance is switched on or when it is switched off. Hence, the reliability of the method is independent of the particular characteristics of the appliance and its environment, as these are taken into account when the reference measurements are made.

This reference spectrum RS2 may also result from a signal picked up by a second antenna situated in a metal enclosure placed in the vicinity of the electrical appliance to be diagnosed. This second antenna is specially placed in a metal enclosure situated near the electrical appliance to be diagnosed, so that the signal picked up by the second antenna represents only electromagnetic noise from the environment of the electrical appliance to be diagnosed. In fact, any partial discharges occurring in the receptacle of the electrical appliance to be diagnosed, the electromagnetic radiation they generate is confined within the receptacle of the electrical appliance, so that these discharges are not picked up by the second antenna. Similarly, the reliability of the method is independent of the features of the environment of the electrical appliance to be diagnosed, as these are taken into account by the reference signal that is received by the second antenna.

Figure 5:
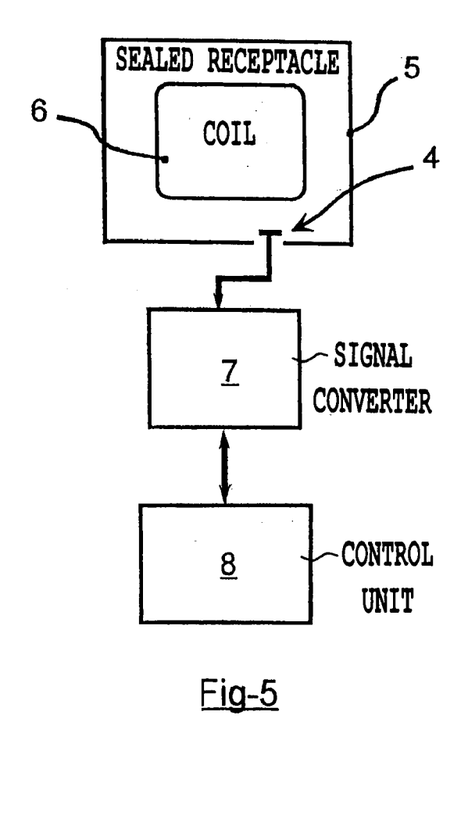
FIG. 5 is a block diagram representing the first implementation of the process according to the invention.

As represented schematically in FIG. 5, the method in the invention may be implemented by connecting the antenna 4 by means of a coaxial cable to the input of a signal converter 7, which is itself connected to a data processing and control unit 8. The converter 7 is driven by the unit 8 to provide a spectral representation of the signal received by the antenna 4 in one or more frequency bands that are transmitted to it by the unit 8. Unit 8 here may be a portable computer, for example.

During the identification stage, the converter 7 is driven by the unit 8 to supply a spectrum RS1 of the signal received by the antenna 4 across a whole range of frequencies, such as for example 200 MHz to 1.5 GHz. This spectrum RS1 is recorded in the unit 8 to identify one or more frequency bands of interest by comparing it with a pre-recorded reference spectrum RS2 in the unit 8. The converter 7 is then driven by the unit 8 to supply a spectrum of the signal received at the antenna 4 for only the frequencies of interest, this spectrum being recorded in the unit 8 for the detection of partial discharges. The detection of partial discharges then consists of detecting peaks with an amplitude greater than a predetermined threshold value, in the spectrum from the converter.

Furthermore, the comparison of the spectrum RS1 of the signal received by the antenna 4 with the reference spectrum RS2 includes a partitioning stage. This partitioning consists of dividing the frequency range into several regular frequency intervals and of calculating the average value of the spectrum for each interval. This partitioning is applied separately to the spectrum representing the signal received by the antenna 4 and to the reference spectrum. The identification of frequency bands of interest then consists of comparing, for each frequency interval, the average value for the spectrum from the antenna with the average value for the reference spectrum, to check whether this frequency band satisfies the chosen comparison criterion or not. The processing time may be reduced by increasing the size of the intervals and, reciprocally, the accuracy may be increased by reducing the size of these intervals. This comparison may also consist of comparing, for each frequency interval, the energy of the signal for each spectrum. In fact, for a given interval, the signal energy in this interval is of a more significant size than the average value of the signal amplitude in this interval.

Figure 6:
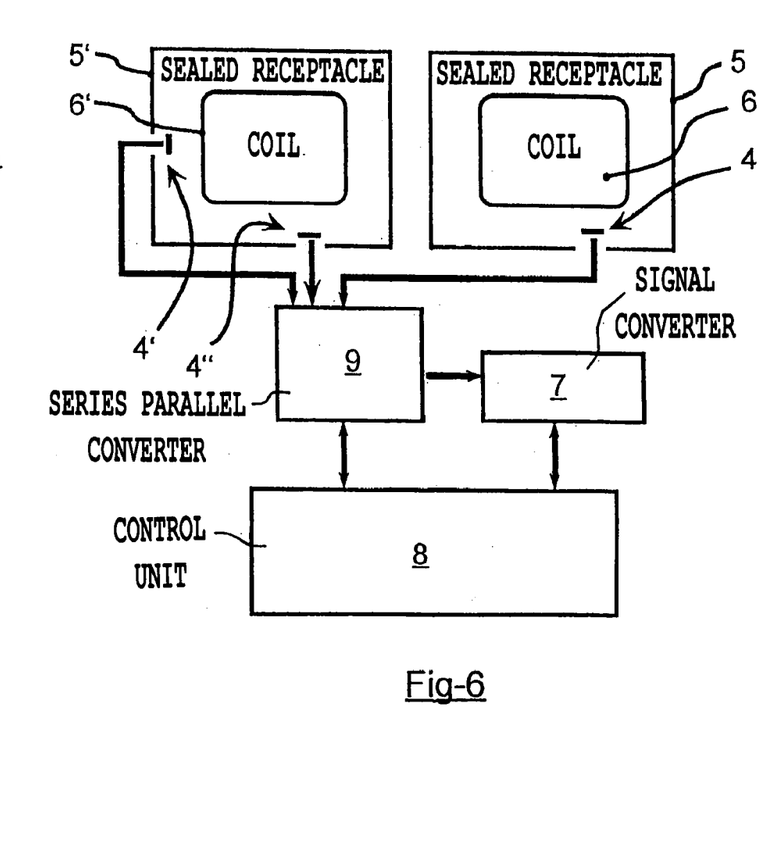
FIG. 6 is a block diagram representing a second type of implementation of the process according to the invention.

In the embodiment shown in FIG. 6, a data processing and control unit 8 is linked to several antennae 4, 4', 4", so as to diagnose the presence of partial discharges simultaneously in several electrical appliances. In this example, two electrical appliances 5, 6 and 5', 6' are each equipped with UHF antennae, these antennae being linked by coaxial cables to a signal converter 7 via a series parallel converter 9. The series parallel converter 9 is driven by the unit 8, so as to select one of the three antennae to submit the signal that it receives to the converter 7, as described later. Hence, it is possible to make an identification of frequencies of interest separately for each antenna in the unit 8. After this identification, the unit 8 can parallelly drive the series parallel converter 9 and the signal converter 7 to select each antenna in turn, so as to monitor each antenna in the unit 8 in a cyclical fashion.

Figure 7:
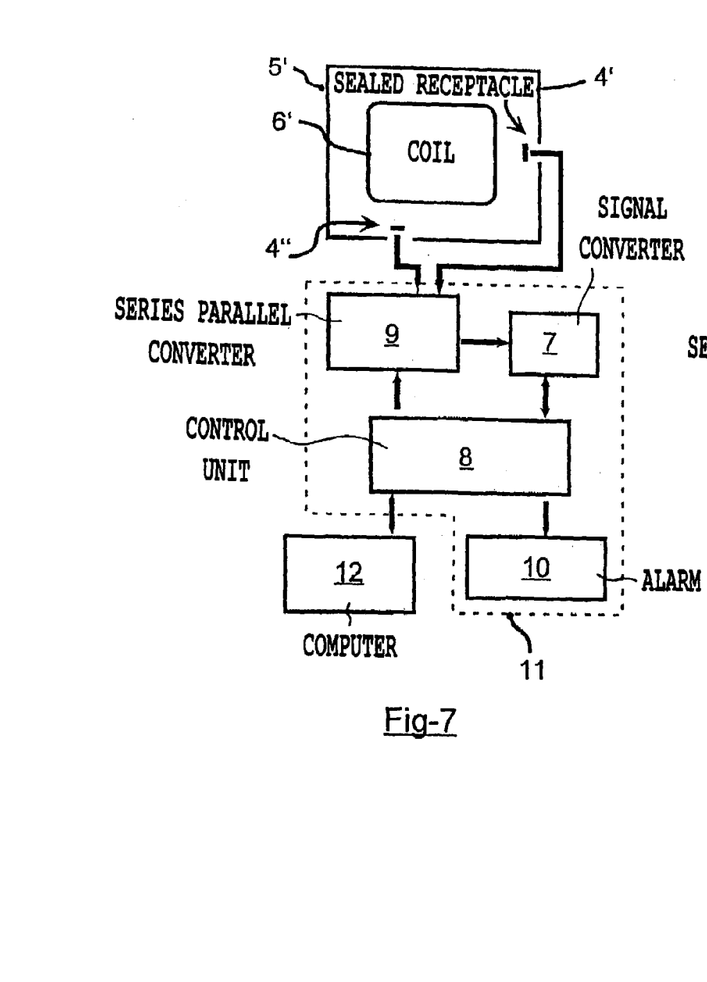
FIG. 7 is a block diagram representing a third type of implementation of the process according to the invention.

In another embodiment shown in FIG. 7, the method is used to permanently monitor an electrical apparatus from a permanently installed specialized unit. Here, the unit 8 is connected to an alarm device 10, such as a sound alarm that is activated when the process of detecting partial discharges crosses a certain threshold. More particularly, the series parallel converter 9, the signal converter 7, the unit 8 and the alarm 10 are grouped in a specialized unit 11, which is installed permanently or for a predetermined period in situ, for example near the electrical appliance to be diagnosed. The unit 8 can be reduced to a microprocessor programmed to drive the series parallel converter 9 and the signal converter 7, with the possibility of communicating with external media such as a computer 12 via a network link for an exchange of data. Several specialized units 11 may be driven by this central computer by means of which an operator can obtain in a centralized fashion the data from each specialized unit 11, and parameter the operation of each specialized unit remotely.

Figure 8:
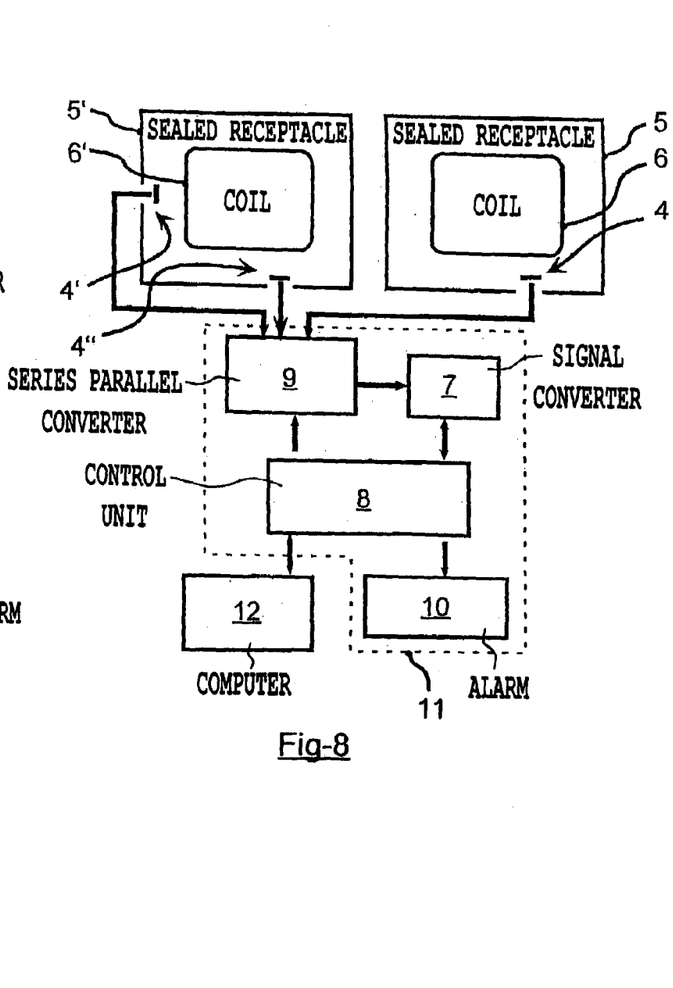
FIG. 8 is a block diagram representing a fourth type of implementation of the process according to the invention.

A similar specialized unit 11 may also be connected to several electrical appliances 5 and 5' under supervision, as represented schematically in FIG. 8. Analogously, this specialized unit 11 is driven by a computer 12 that is programmed to supply operating parameters to the series parallel converter 9 and to the signal converter 7 via the central unit 8.

In FIGS. 6 to 8, the series parallel converter 9 combines the parallel input signal flows produced by the antennae, such as 4, 4' and 4", into a single flow by using a time signal or cut-out signal produced by the unit 8, and defines the multiplexing time windows of the input signals, the number of time windows in a cycle corresponding to the number of antennae managed by the unit 8.

Figure 9:
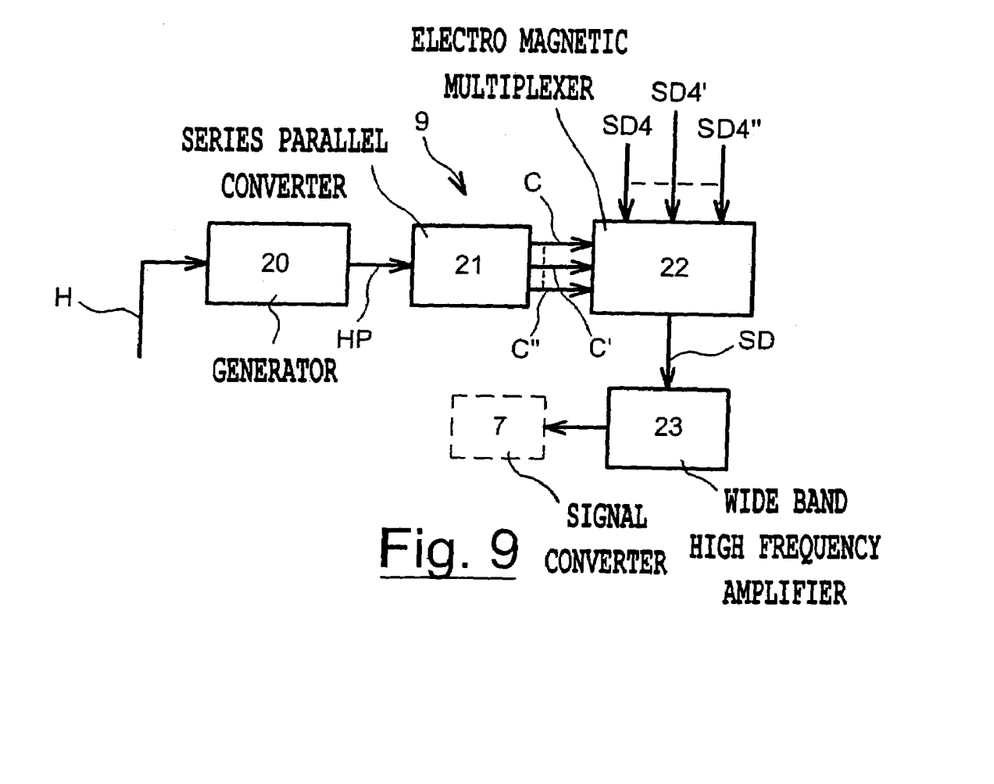
FIG. 9 illustrates in a schematic way the structure of a series parallel converter comprising an electromagnetic multiplexer used for processing the signals from the antennae.
Figure 10:
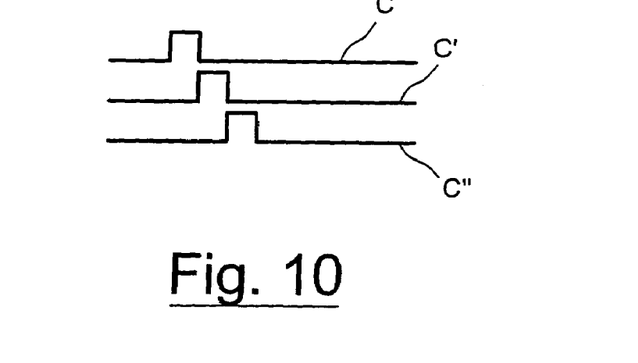
FIG. 10 illustrates in a schematic way the power signals sent to the electromagnetic multiplexer.

FIGS. 9 and 10 illustrate an example of implementing the series parallel converter 9 including a high frequency electromagnetic multiplexer. FIG. 9 shows three signals, SD4, SD4' and SD4", produced by the antennae 4, 4' and 4". The signal H is a time signal produced, for example, by an RS232/RS422/RS495/USB series port of the unit 8 and whose pulses define the multiplexing time windows. The multiplexing signal H is transformed by a generator 20 into a power signal of type TTL, indicated in FIG. 9 by the reference HP, and then by series/parallel converter 21 into a series of power signals C, C' and C", which define all the time windows time-shifted two by two and illustrated in FIG. 10. These power signals C, C' and C" serve as signals for controlling the relays of an electromagnetic multiplexer 22 receiving signals SD4, SD4' and SD4". As the power signals define the time-shifted windows, the input signals SD4, SD4' and SD4" are divided and multiplexed into an output signal SD that is amplified in a wide-band high-frequency amplifier 23, having been sent to the signal converter 7.

As indicated above, the process of detecting partial discharges can be monitored over time and be normalized by experiment in the form of a datum representing the insulation state of the appliance under scrutiny, and this allows a diagnostic to be carried out on the appliance under scrutiny for scheduled maintenance.

More particularly, the trace of a signal after the subtraction of noise is continuously recovered and its energy (surface area between the trace and the abscissa) is calculated and normalized; such normalization may correspond to the energy division by a value set by experiment. The value resulting from normalization may be used to time-index or classify the process of detecting partial discharges and hence the insulation state of the electrical appliance under scrutiny. This resulting value is compared to pre-established values corresponding to pre-established levels of alarm activation, such levels of alarm activation indicating, respectively, the different insulation states of the appliance under scrutiny, for example, normal state, abnormal state, critical state . . . . If one of these activation levels is exceeded by the resulting value, a corresponding alarm signal is generated. The alarm may be audible, visible or otherwise, in order to send an appropriate signal to the personnel in charge of checking and supervising the electrical appliance. It may be placed near the electrical appliance under scrutiny or at a distance from it.

Figure 11:
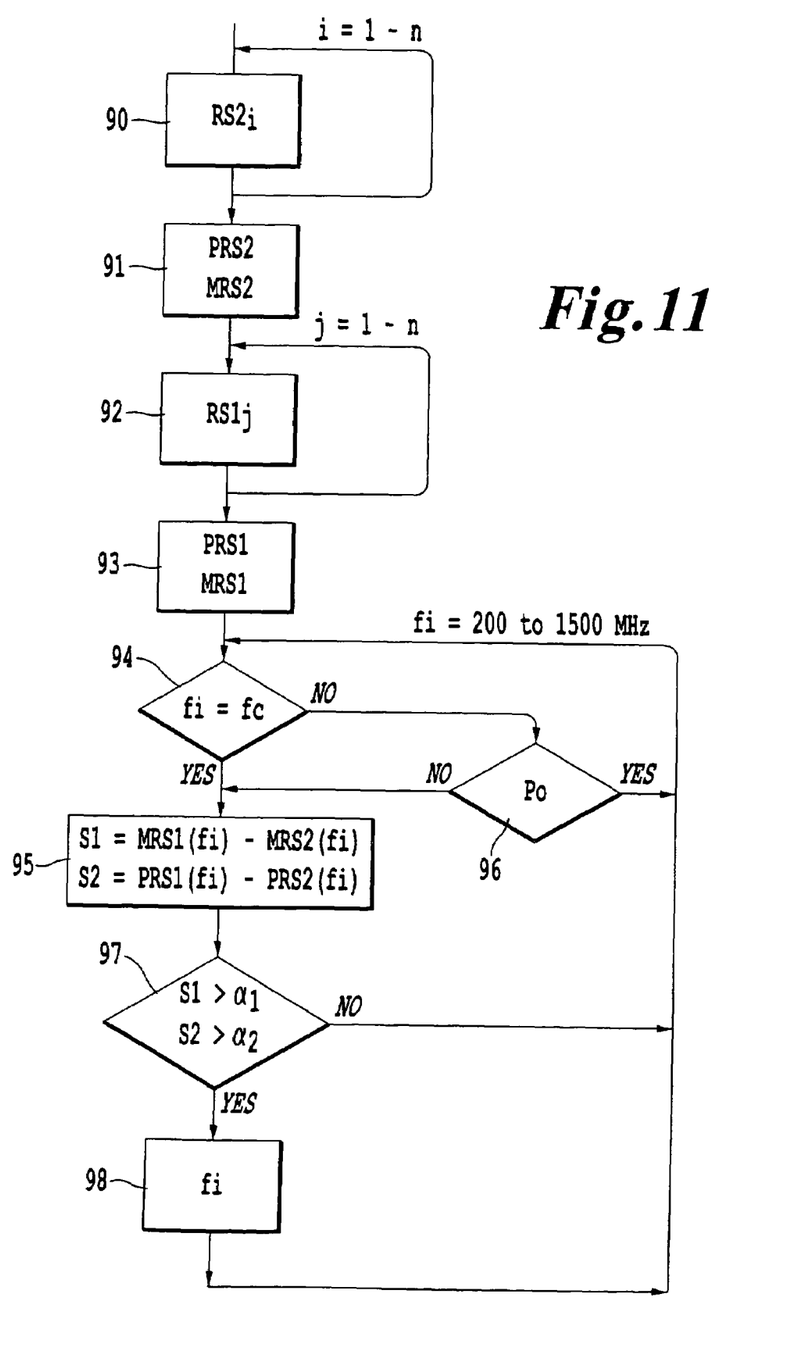
FIG. 11 illustrates an algorithm for identifying the frequencies of interest using the method according to the invention.

FIG. 11 illustrates an algorithm for the detection of frequencies of interest by taking into account frequencies fc that are known to represent a known type of noise (radio-telephone frequencies, television video signals, etc. . . . ). These known frequencies are stored in a database for the implementation of the algorithm.

Block 90 in FIG. 11 represents an acquisition stage of a series i of noise spectra RS2$i$. Each noise spectrum RS2$i$ is stored in an acquisition mode called "maximum peak", according to which the amplitude of the spectrum at each frequency is kept constant until a new amplitude value that is more important than the preceding one is detected. This stage 90 may be repeated in a cyclical fashion over time. Following stage 90, in 91 an average amplitude value and a maximum amplitude value are calculated for each frequency in the series of noise spectra RS2$i$, so as to obtain an average-value reference spectrum and a maximum peak indicated by MRS2 and PRS2 respectively.

Block 92 represents the acquisition stage of the spectrum of the signal received by antenna 4. In this stage, a series j of spectra RS1$j$ is acquired and memorized. This stage 92 may also be repeated cyclically over time. Following stage 92, in stage 93 an average amplitude value and a maximum amplitude value are calculated for each frequency in the series of spectra RS2$j$, so as to obtain an average-value spectrum and a maximum peak spectrum of the signal picked up by antenna 4 indicated by MRS1 and PRS1 respectively.

It should be noted that in stages 90 and 92, the spectra are constructed with the same level of frequency resolution.

After stage 93, there follows repeated processing for the detection of frequencies of interest, starting for example from an initial frequency of 200 MHz and ending for example at a frequency of 1500 MHz, with for instance an incremental increase of 1 MHz.

In stage 94, it is determined whether the current frequency fi is a known frequency fc and, if so, the procedure continues to stage 95. If not, it passes to stage 96.

In stage 95, the amplitude difference is calculated, at frequency fi, between the spectrum RS1 and the spectrum RS2, for the average values and for the maximum peak values. This is represented by the relationships:

$$S1 = MRS1(fi) - MRS2(fi)$$

$$S2 = PRS1(fi) - PRS2(fi).$$

If either of the values S1 and S2 is greater than a threshold value indicated by α, as indicated in block 97, the current frequency fi is retained as a frequency of interest, as represented in block 98. In the opposite case, repeated processing is performed for a new frequency fi by returning to the stage indicated in block 94.

When at stage 96, that is, after detecting that the current frequency is not a known frequency of known noise, the distribution of the amplitude of spectrum RS1 is calculated and the distribution probability Po of this amplitude in the series of spectra RS1$j$ is verified.

In the event that this distribution probability follows a uniform or Gaussian distribution, repeated processing is performed on a new current frequency by returning to stage 94. More particularly, one starts from the premise that, in general, the nature of electromagnetic noise is more deterministic than probabilistic. The techniques for acquiring the signals SD according to the invention imply the acquisition of UHF signals at time intervals of the order of a few seconds to a few minutes, or even a few hours, either continuously or spread out over time. If the signal picked up at a given frequency corresponds to electromagnetic noise, it is possible that there is no correlation between signals acquired at different moments, that is, that these events are independent of each other. Such situations may be regularly detected by using a Gaussian distribution. According to basic theory, random or independent events are best modelled by a Gaussian or normal distribution. The other possibility for characterizing deterministic electromagnetic noise is a rectangular or uniform distribution. In other words, the amplitude of the events remains constant over time within an acceptable limit of statistical variation. The signals resulting from such events are dependent on the insulation condition of the electrical appliance under scrutiny.

In stage 94, if the distribution probability does not follow a normal or Gaussian distribution, successive processing at stages 95, 97 and 98 ensues, with the difference that at stage 97 the threshold value α is adjusted as a function of confidence rates of the identification probability of the distribution.

Following stage 98, repeated processing ensues for a new current frequency from block 94 until a full sweep of the frequencies of the 200–1500 MHz frequency band is complete.

The invention claimed is:

1. Method of detecting partial discharges in an electrical appliance, insulated in a receptacle, by means of an UHF antenna placed in this receptacle, comprising an analysis of a spectrum (RS1) of an electromagnetic signal picked up by the antenna and of an identification of several frequencies of interest (B1, B2) in the spectrum, for each of which the signal has an amplitude that is greater than a predetermined threshold value, whereby, to identify frequencies of interest, a comparison of the spectrum of the signal received by the antenna is made with a reference spectrum (RS2) representing electromagnetic noise devoid of any signal coming from the partial discharges, as follows:
   for several predefined frequency intervals in the two spectra (RS1, RS2), a calculation of a characteristic value of each interval is made,
   a comparison is made, interval by interval, of the characteristic values of the two spectra (RS1, RS2),
   known frequencies (fc) of known electromagnetic noise are taken into account when comparing the spectrum of the signal received by the antenna with the reference spectrum, and
   the probability distribution of the amplitude of the spectrum (RS1) of the signal received is taken into account, at a given frequency.

2. Method according to claim 1, whereby the characteristic value of the interval is an average value of the amplitude of the signal in the interval.

3. Method according to claim 1, whereby the characteristic value of the interval is the energy of the signal in the interval.

4. Method according to claim 1, in which the reference spectrum (RS2) represents an electromagnetic signal picked up by the antenna when the electrical appliance is switched off or when the electrical apparatus is switched on for the first time.

5. Method according to claim 1, in which the reference spectrum (RS2) represents an electromagnetic signal picked up by a second UHF antenna placed in a metal enclosure near the electrical appliance.

6. Method for supervising an insulation state of an electrical appliance insulated in a receptacle, comprising detecting partial discharges over time according to one of claims 1 to 5, of following a rate of detection of partial discharges over time and, when this rate passes a certain threshold, of triggering an alarm.

7. Method according to claim 6, in which the rate of detection of partial discharges over time is normalized in a form of a datum representing the insulation state of the electrical appliance.

8. Method according to claim 6, in which the alarm is an audible or visual alarm placed near to or at a distance from the electrical appliance under scrutiny.

* * * * *